United States Patent
Beach

(10) Patent No.: US 7,166,173 B2
(45) Date of Patent: Jan. 23, 2007

(54) METHOD OF SIMULTANEOUSLY INITIALIZING TWO ANTIFERROMAGNETIC LAYERS IN A MAGNETIC SENSOR

(75) Inventor: Robert S. Beach, Los Gatos, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 444 days.

(21) Appl. No.: 10/692,550

(22) Filed: Oct. 24, 2003

(65) Prior Publication Data

US 2004/0095690 A1    May 20, 2004

Related U.S. Application Data

(62) Division of application No. 09/809,686, filed on Mar. 14, 2001, now abandoned.

(51) Int. Cl.
*C12D 1/00* (2006.01)
*H01F 10/08* (2006.01)
*H01F 10/32* (2006.01)

(52) U.S. Cl. .................... 148/108; 29/603.13
(58) Field of Classification Search ............ None
See application file for complete search history.

(56) References Cited

U.S. PATENT DOCUMENTS

| | | | |
|---|---|---|---|
| 5,465,185 A | 11/1995 | Heim et al. ........ | 360/113 |
| 5,729,410 A | 3/1998 | Fontana, Jr. et al. ...... | 360/113 |
| 5,768,069 A | 6/1998 | Mauri ............. | 360/113 |
| 5,867,351 A | 2/1999 | Gill ............... | 360/113 |
| 6,005,753 A | 12/1999 | Fontana, Jr. et al. ...... | 360/113 |
| 6,023,395 A | 2/2000 | Dill et al. .......... | 360/113 |
| 6,097,579 A | 8/2000 | Gill ............... | 360/324.2 |
| 6,129,957 A | 10/2000 | Xiao et al. ......... | 427/548 |
| 6,137,662 A | 10/2000 | Huai et al. ......... | 360/327.22 |
| 6,219,211 B1 | 4/2001 | Gill et al. .......... | 360/324.11 |
| 6,249,406 B1 | 6/2001 | Gill et al. .......... | 360/324.11 |
| 6,411,478 B1 | 6/2002 | Mao et al. ......... | 360/324.2 |
| 6,469,878 B1 | 10/2002 | Mack et al. ........ | 360/324.12 |
| 6,487,056 B1 | 11/2002 | Gibbons et al. ..... | 360/327.31 |

OTHER PUBLICATIONS

R.S. Beach et al., "Orthogonal Pinning of Two Ferromagnetic Layers in a Synthetic Spin Valve", Jun. 17, 2002, Applied Physics Letters, vol. 80, No. 24, pp. 4576-4578.
O. Redon et al. "Extra Current Channels in Longitudinally Biased Magnetic Tunnel Junctions", Journal of Applied Physics, vol. 87, No. 9, May 1, 2000, pp. 4688-4690.

*Primary Examiner*—John P. Sheehan
(74) *Attorney, Agent, or Firm*—Patterson & Sheridan, L.L.P.

(57) ABSTRACT

Magnetic tunnel junction (MTJ) and charge perpendicular-to-plane (CPP) magnetic sensors are disclosed which have a first antiferromagnetic layer for pinning the magnetization direction in a pinned layer and a second antiferromagnetic layer for providing bias stabilization of a free layer. The two antiferromagnetic layers may be formed from the same material and using a spin-flop effect may be initialized simulataneously. A disk drive using these sensors is disclosed.

4 Claims, 10 Drawing Sheets

METHOD OF SIMULTANEOUSLY INITIALIZING TWO ANTIFERROMAGNETIC LAYERS IN A MAGNETIC SENSOR

This is a divisional application of application Ser. No. 09/809,686 filed Mar. 14, 2001 now abandoned.

BACKGROUND OF THE INVENTION

1. Field of the Invention

The present invention relates to sensors which can be used in a disk drive for magnetic read back and a manufacturing method thereof.

2. Description of the Background Art

Magnetic sensors in many applications are required to have very high sensitivity. One major example is the use of magnetic read back sensors in disk drives. As the density of recorded information increases with each succeeding product the required sensitivity of the sensor must also increase. Two classes of sensors having very high sensitivity are the magnetic tunnel junction sensor (MTJ) and the charge perpendicular-to-plane sensor (CPP). These sensors both depend on utilizing spin dependent electron movement through a thin nonmagnetic separation layer. On one side of the separation layer is a ferromagnetic layer, called the pinned layer, in which the direction of magnetization is fixed. On the other side of the separation layer is a ferromagnetic layer, called the free layer, in which the direction of the magnetization is free to respond to an applied field. In a disk drive the applied field is from a previously written transition on a disk. In other applications the applied field could come from the position of an external magnet or from the change in location of the sensor relative to a field.

In disk drive applications, it is desirable to achieve maximum sensitivity and linearity. To achieve maximum linearity it is desirable for the magnetization in the free layer in the absence of an external field be substantially parallel with the direction of the recorded track. It is also desirable for the magnetization of the pinned layer to be perpendicular to the magnetization of the free layer in the absence of an applied field. Accordingly it is desired that the magnetization in the pinned layer be substantially perpendicular to the direction of the recorded track.

Another requirement for the free layer is that there be longitudinal magnetic bias stabilization. Imposing a preferred magnetization direction in the free layer along the axis of the free layer parallel to the recording medium and perpendicular to the direction of the track insures good linearity and provides robustness to deleterious effects such as Barkhausen noise.

A common method of providing for the pinning of the pinned layer is to place a layer of antiferromagnetic material (AFM) adjacent to the pinned layer. At some point in the manufacture of the head, the structure is heated above the blocking temperature of the AFM and the device is placed in an external magnetic field which is perpendicular to the eventual direction of the recorded track. The blocking temperature of an AFM material is the temperature above which the material no longer has any exchange coupling strength. The sensor is then cooled in the presence of the field. The applied field will orient the pinned layer in the proper direction and as the AFM cools below the blocking temperature, exchange coupling will maintain the orientation of the magnetization in the pinned layer. For the pinned layer this is the pinning process. This process is also called setting the AFM.

A known method for longitudinal biasing of the free layer is to provide two hard magnets, one on each side of a portion of the free layer. This is referred to as hard biasing. It is generally desirable to electrically insulate the hard bias material from the layers comprising the active sensor. During the manufacture of the sensor, the direction of the magnetization in the hard magnet must be set by placing the sensors in a large magnetic field causing permanent alignment of the direction of magnetization. The requirement of insulating the hard bias magnets is a detractor for this approach.

A preferred method of providing longitudinal bias for the free layer is to use another AFM layer and rely on exchange coupling. The principle difficulty with this approach is that the direction of magnetization in the free layer must be substantially perpendicular to the direction of magnetization in the pinned layer. Thus the steps of heating and subsequent cooling in a field would be appropriate for one of the AFM layers, but not the other. It is known to use two different AFM materials which have two distinctly different blocking temperatures. The AFM layer with the highest blocking temperature is set first. Then the field angle is rotated 900 and the second AFM layer is set at a lower temperature. There is generally only one optimum AFM material which would serve for both the pinned layer and longitudinal stabilization of the free layer. However because of the requirement to have AFM materials with different blocking temperatures, the optimum choice of AFM materials has been compromised. What is needed is a sensor structure and a method of manufacturing the sensor which allows for the use of two AFM layers which can be set without compromising other aspects of the sensor.

SUMMARY OF THE INVENTION

The invention is an improved design and method of manufacturing of magnetic sensors which have the sense current substantially perpendicular to the direction of the layers in the sensor. These sensors use an antiparallel pinned substructure for the pinned layer or the bias stabilization of the free layer. In all cases there are two antiferromagnetic layers: one for setting the direction of magnetization of the pinned layer and the other for use in the bias stabilization of the free layer. These AFM layers may be formed from the same material. Both AFM layers are simultaneously initialized in the same procedure utilizing a spin-flop effect.

For a fuller understanding of the nature and advantages of the present invention, reference should be made to the following detailed description taken together with the accompanying figures.

DETAILED DESCRIPTION OF THE INVENTION

Figure 1:
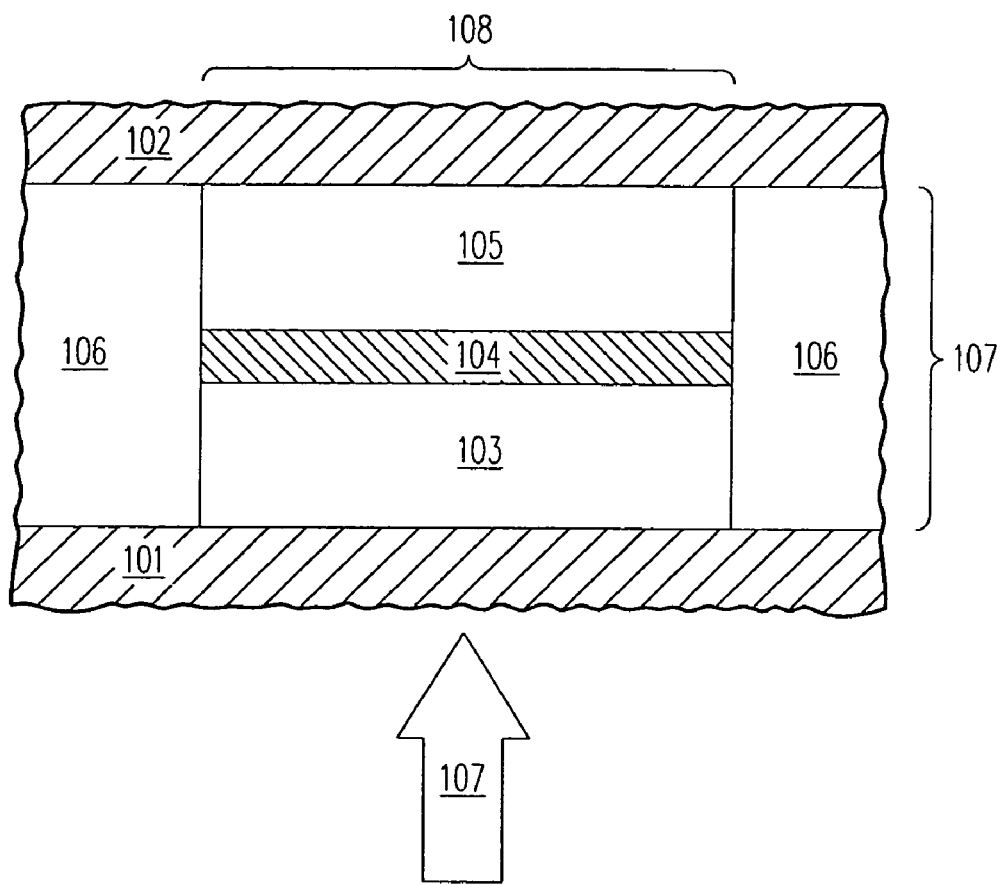
FIG. 1 shows a general view of MTJ and CPP sensors.

FIG. 1 shows a diagram of some of the features of all of the sensor structures described herein. In FIG. 1 there is a gap 107 between two metallic layers 101 and 102. Commonly the metallic layers 101 and 102 are the electrical leads to the sensor. It is also possible in some embodiments for the layers 101, 102 to also serve as magnetic shields for the sensor. The sensor comprises a pinned layer 103, a nonmagnetic separation layer 104, and a free layer 105. The pinned layer and the free layer require magnetic stabilization layers which are not shown in FIG. 1. The width 108 of the sensor, specifically the active portion of the free layer, approximately defines the magnetic trackwidth in a application such as a disk drive. Outside of the sensor location the gap is filled with an insulating material 106. In all cases the direction of the sense current 107 is perpendicular to the layers in the sensor. In a typical mode of operation sense current 107 is passed through the sensor and the change in voltage resulting in a change in sensor resistance is monitored. The principle difference between MTJ and CPP sensors is that the nonmagnetic separation layer 104 in a MTJ sensor is a thin insulator and in a CPP sensor is a thin conductor. The nonmagnetic separation layer in a MTJ sensor is sometimes called a barrier layer. MTJ sensors tend to be higher impedance devices compared to CPP sensors. Both sensors depend on modulating the spin-dependent movement of electrons across the nonmagnetic separation layer by changing the direction of the magnetization in the free layer in response to an external applied magnetic field. For the purposes of this invention it is immaterial whether the current direction 107 is from bottom to top as shown in FIG. 1 or from top to bottom. It is also immaterial whether the pinned layer 103 is on the bottom of the gap as shown in FIG. 1 or on the top of the gap. For clarity all the structures are drawn with the pinned layer on the bottom.

Figure 2:
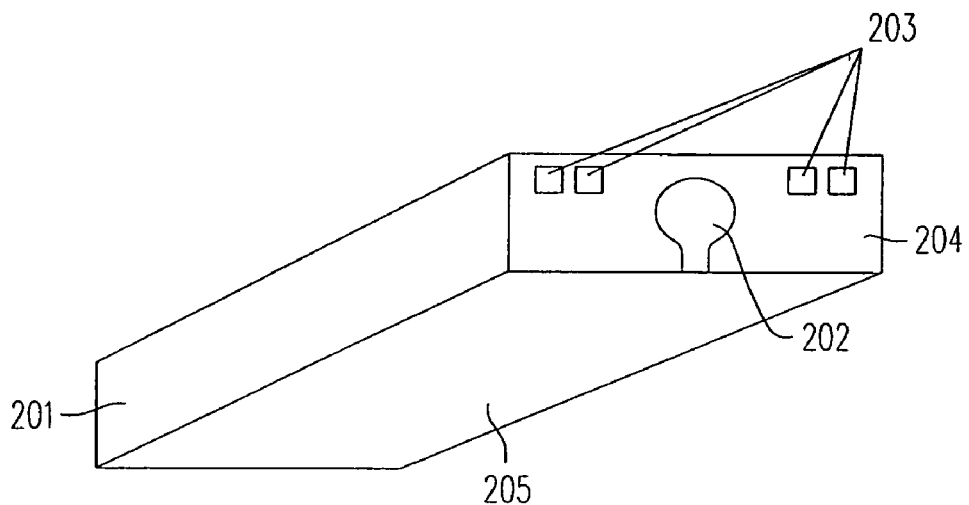
FIG. 2 shows a view of a sensor as constructed on a slider.

For disk drive applications the view of the sensor in FIG. 1 is of the sensor as presented to the disk. The sensor is ordinarily constructed on a slider as illustrated in FIG. 2. In FIG. 2 the sensor 202 is constructed on the trailing surface 204 of a slider 201. Metallic pads 203 are provided to make electrical connections with the sensor. These sensors are read-only elements. There is a write head also placed on the slider for recording information to the disk.

Several specific examples of sensors will now be discussed. All of these sensors have several common attributes:
1) The sense current is perpendicular to the plane of the layers of the sensor and flows from one lead across the gap through the sensor to the other lead.
2) The nonmagnetic separation layer between the pinned layer and the free layer is either an thin insulator layer such as alumina in the case of the MTJ sensor or a thin metal layer such as Cu in the case of the CPP sensor.
3) All the sensors have at least one antiparallel pinned (AP pinned) substructure. The AP pinned substructure can serve as the pinned layer of the sensor or as a portion of the bias tabs for the free layer. In one embodiment the AP pinned substructure comprises the free layer.
4) All the sensors have two separate substantially planar antiferromagnetic (AFM) layers. One is used to stabilize the pinned layer and the other is used to assist in the longitudinal stabilization of the free layer. In accordance with this invention, the two AFM layers can be constructed of substantially the same material.
5) In all cases the two AFM layers can be set during the same initialization procedure in accordance with this invention.

Certain of the layers common to the embodiments discussed below have similar compositions. The ferromagnetic free layer and the ferromagnetic portion of the pinned layers are usually made of alloys of NiFe, CoFe, or CoNiFe. The nonmagnetic layer between the two ferromagnetic layers in an AP pinned configuration is commonly Ru but can also be made from other materials such as Ta. Copper is also used as a nonmagnetic conductor. The AFM materials can be made from materials containing Mn such as PtMn, NiMn, FeMn and IrMn. The AFM material can also be made from materials which do not contain Mn such as combinations of NiO or CoNiO.

Figure 3A:
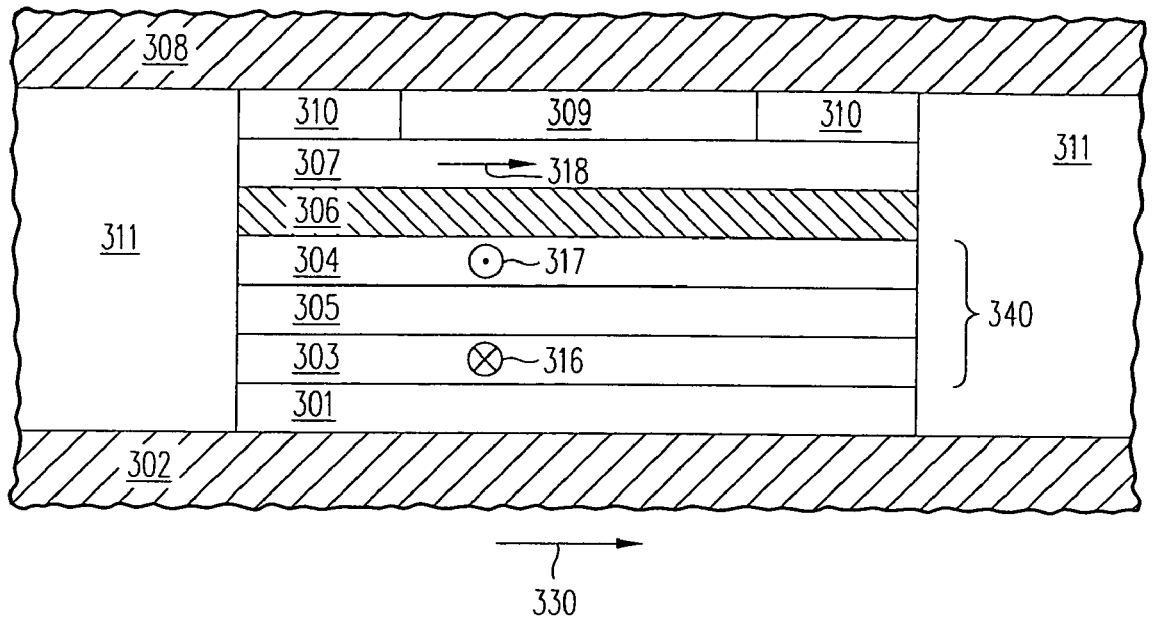
FIG. 3a shows a view of the layers in a sensor which has a pinned layer comprising an antiparallel pinned substructure and a trackwidth defined by forming a nonmagnetic layer over a portion of the free layer.

FIG. 3a shows one preferred embodiment of a sensor in more detail. Additional layers to promote adhesion, control film growth, enhance sensitivity, or control film surface smoothness may also be present. A first AFM layer 301 is deposited on a lead 302. Two ferromagnetic layers 303, 304 are deposited on the first AFM layer 301. The two ferromagnetic layers 303, 304 are separated by a nonmagnetic layer 305. The two ferromagnetic layers 303 and 304 together with the nonmagnetic layer 305 comprise the AP pinned substructure 340. This AP pinned substructure 340 serves as the pinned layer for this sensor. In the absence of an external field the direction of magnetization 316 in the first ferromagnetic layer 303 is approximately opposite to the direction of magnetization 317 of the second ferromagnetic layer 304. The next layer is the nonmagnetic separation layer 306. The free layer 307 is deposited on the nonmagnetic separation layer 306. In the absence of an external magnetic field the direction of magnetization 318 in the free layer 307 is substantially parallel to the recording medium and perpendicular to the magnetizations 316, 317 in the AP pinned substructure 340. The layer between the free layer 307 and the lead 308 has two portions. One portion 309 comprises an nonmagnetic metal. This portion 309 could also be an insulator. This nonmagnetic portion 309 defines the active portion of the free layer 307 and therefore the magnetic trackwidth when the sensor is used in a disk drive. The other portion is a second AFM layer 310. This layer provides magnetic bias stabilization for the free layer 307. The portion of the free layer 307 in direct contact with the AFM layer 310 is substantially inactive for sensing an external field. Except for the second AFM layer 310 and the nonmagnetic layer 309, the widths of the layers are typically wider than the magnetic track (determined by the active portion of the free layer). The gap beyond the location of the sensor layers is filled with an insulating material 311.

Figure 3B:
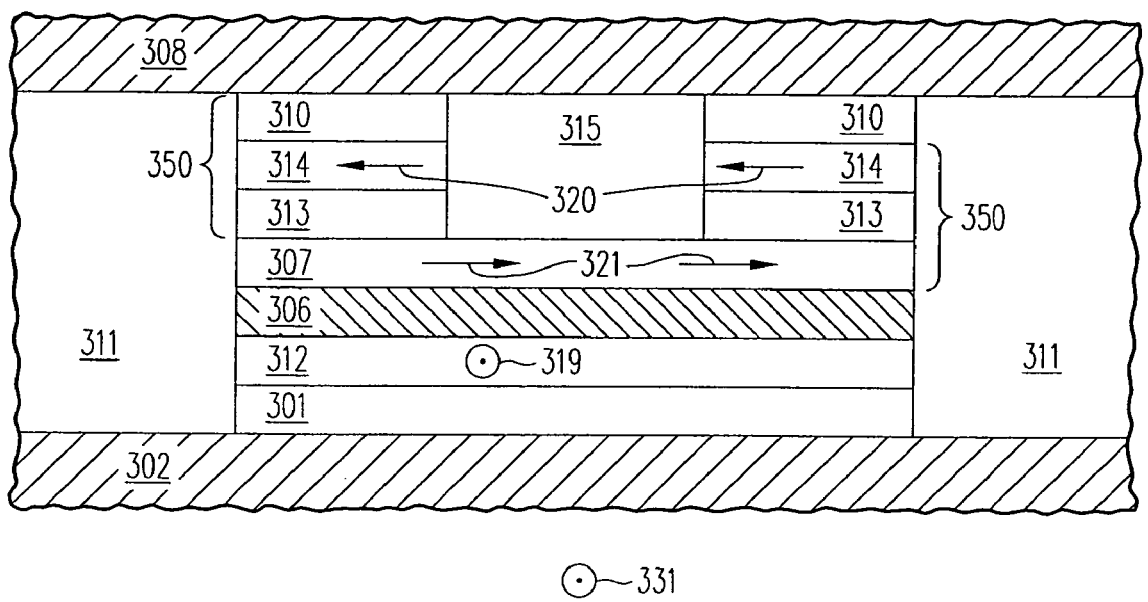
FIG. 3b shows a view of the layers in a sensor which has bias tabs comprising an antiparallel pinned substructure and a trackwidth defined by forming a nonmagnetic layer over a portion of the free layer.

The structure shown in FIG. 3b is similar to that illustrated in FIG. 3a in that the physical width of the pinned and free layers are wider than the magnetic track width. A first AFM layer 301 is deposited on the bottom lead 302. A single ferromagnetic pinned layer 312 is deposited on the first AFM layer 301. The nonmagnetic separation layer 306 is formed between the pinned layer 312 and the free layer 307. The active region of the free layer is defined by covering a portion of the free layer with a nonmagnetic metal or insulating layer 315. The other portion of the free layer is covered with a AP pinned substructure 350 comprising a thin nonmagnetic layer 313, a ferromagnetic layer 314, and a portion of the free layer 307. In this configuration the direction of magnetization 320 in the ferromagnetic layer 314 is controlled with a second AFM layer 310. The magnetization 321 in the portion of the free layer 307 adjacent to the ferromagnetic layer 314 and the nonmagnetic layer 313 is pinned opposite to the magnetization 320 in the ferromagnetic layer 314 thus providing magnetic bias stabilization in the active portion of the free layer. The upper lead 308 is placed on the second AFM layer 310.

In FIG. 3a the AP pinned substructure 340 is comprised in the pinned layer. In FIG. 3b the AP pinned substructure 350 is comprised in the free layer bias stabilization layers. These latter layers comprising a nonmagnetic metal 313, a ferromagnetic layer 314 and an AFM layer 310 are sometimes referred to as bias tabs 360. One minor disadvantage of the structures in FIG. 3 is that the sense current flows both in the active and inactive portion of the sensor. This current shunting has the practical effect of reducing the overall sensitivity of the sensor. An embodiment which does not have this disadvantage is shown in FIGS. 4a,b.

Figure 4A:
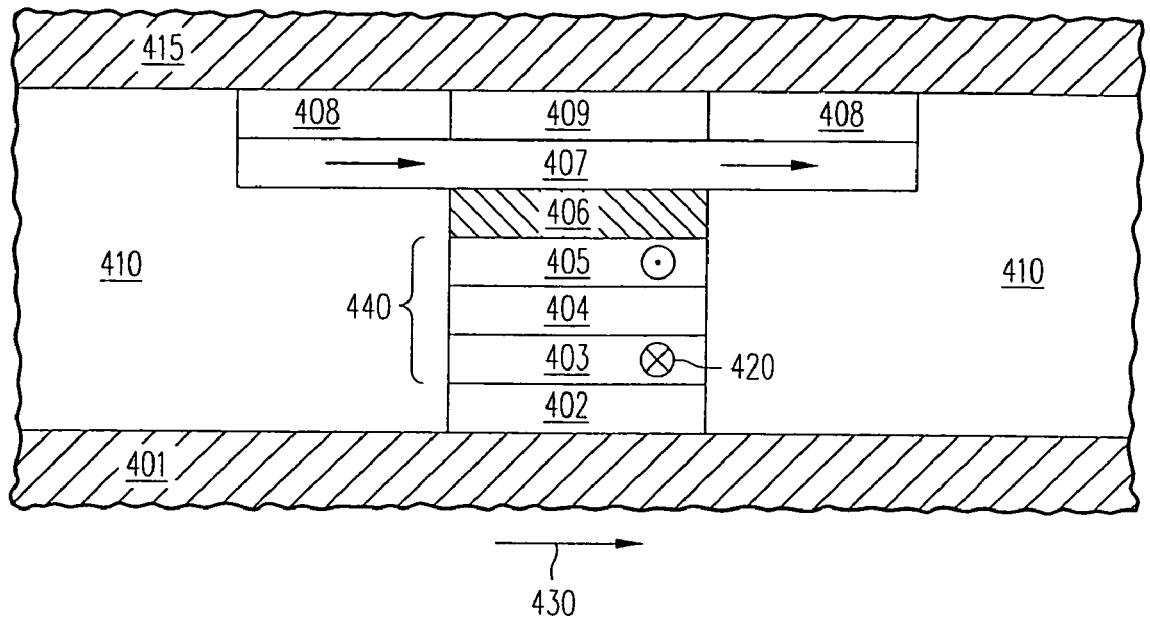
FIG. 4a shows a view of the layers in a sensor which has a pinned layer comprising an antiparallel pinned substructure and a magnetic trackwidth approximately equal to the width of the barrier layer.

The embodiment shown in FIG. 4a has a first AFM layer 402 deposited on a lead 401. An AP pinned substructure 440 comprising two ferromagnetic layers 403, 405 separated by a nonmagnetic layer 404 is constructed on the first AFM layer 402. The free layer 407 is separated from the pinned layer by the nonmagnetic separation layer 406. A portion of the free layer is covered by a nonmagnetic metal or insulating layer 409. Another portion of the free layer is covered by a second AFM layer 408. The second AFM layer 408 is adjacent to a lead 415. As was the case in FIGS. 3a,b the remaining portion of the gap is filled with an insulating material 410. In this embodiment the magnetic trackwidth is approximately defined by the width of the pinned layer comprising in this case the layers in the AP pinned substructure 440. The shunting current is greatly reduced compared to the sensors illustrated in FIGS. 3a,b.

Figure 4B:
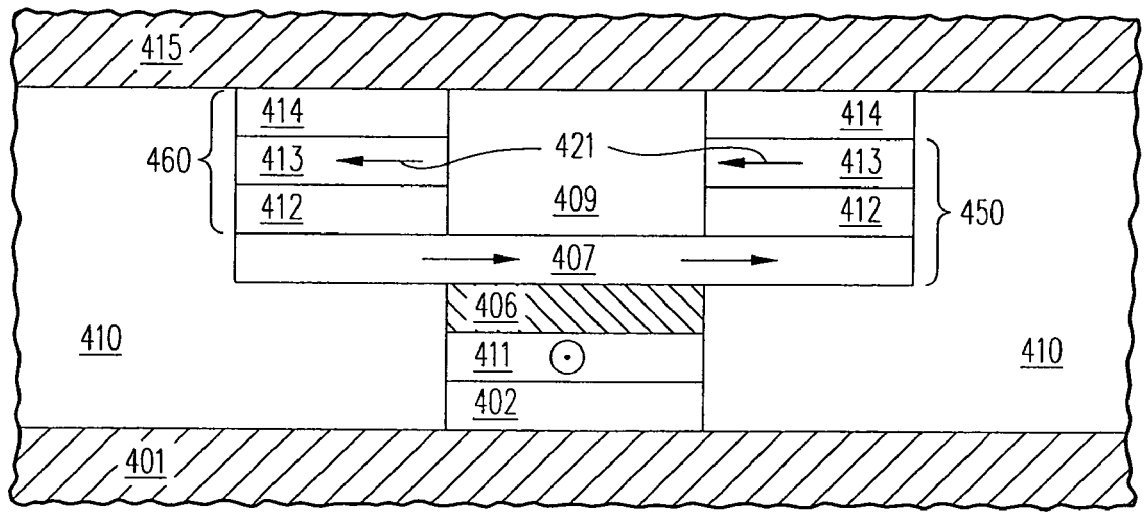
FIG. 4b shows a view of the layers in a sensor which has bias tabs comprising an antiparallel pinned substructure and a magnetic trackwidth approximately equal to the width of the barrier layer.

An alternative embodiment is shown in FIG. 4b. In this case the pinned layer 411 is a single layer. The free layer 407 is separated from the pinned layer 411 by a nonmagnetic separation layer 406. The AP pinned substructure 450 comprises a portion of the free layer 407, a nonmagnetic layer 412, and a ferromagnetic layer 413. The bias tabs 460 comprise a nonmagnetic layer 412, a ferromagnetic layer 413 and the AFM layer 414. The AFM layer 414 controls the direction of magnetization in the ferromagnetic layer 413. A lead 415 is placed on the second AFM layer 414. The width of the pinned layer 411 is approximately equal to the desired magnetic trackwidth. As was the case for the structure shown in FIG. 4a, the shunting current is minimized.

One of the disadvantages of the sensor structure shown in FIGS. 4a,b is that the width of the portion of the free layer covered by the nonmagnetic metal 409 is preferably equal to the width of the nonmagnetic separation layer 406 and the pinned layer below the nonmagnetic separation layer. It is also desirable that the nonmagnetic metal 409 is aligned with the barrier layer 406. An embodiment which does not have this alignment constraint is illustrated in FIG. 5.

Figure 5:
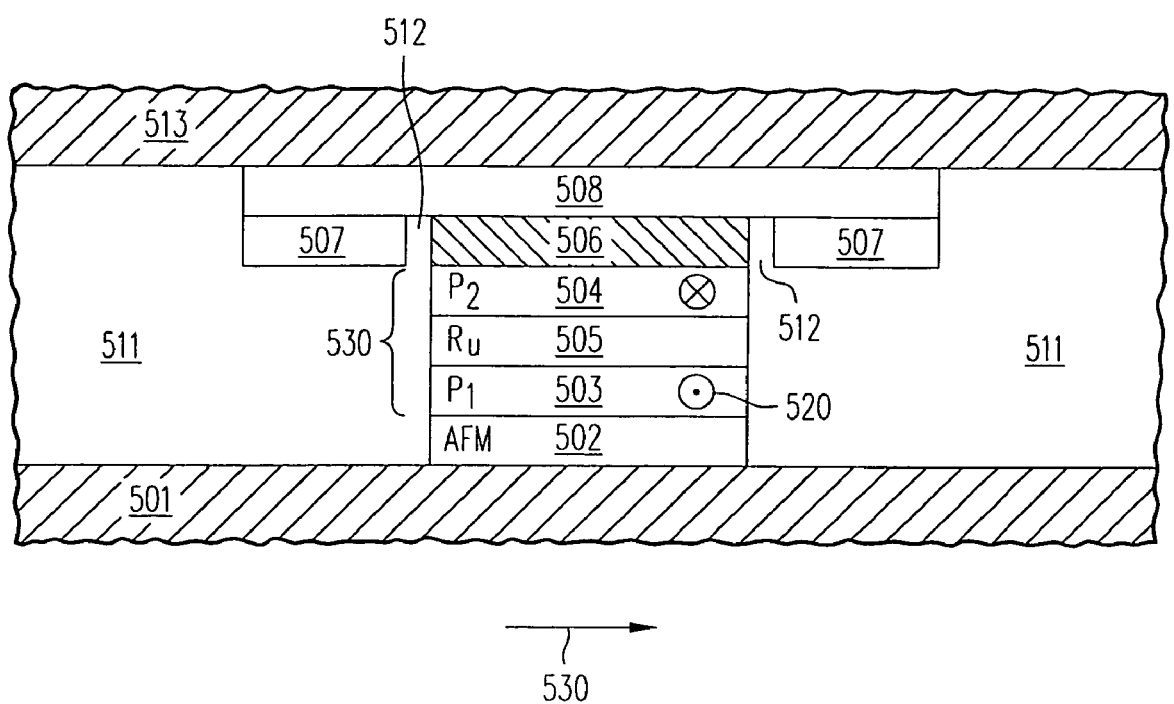
FIG. 5 shows a view of the layers in a sensor which has a pinned layer comprising an antiparallel pinned substructure and a bias stabilization AFM layer on the same side of the free layer as the pinned layer.

In FIG. 5 the first AFM layer 502 is placed on a lead 501. The sensor pinned layer is an AP pinned substructure 530 comprising two ferromagnetic layers 503, 504 separated by a nonmagnetic layer 505. The free layer 508 is separated from the pinned layer by the nonmagnetic separation layer 506. The second AFM layer 507 providing magnetic bias stabilization for the free layer 508 is on the same side of the free layer as the nonmagnetic separation layer 506. This reduces the alignment requirements associated with the sensor illustrated in FIGS. 4a,b. In FIG. 5 it is desirable to insulate the second AFM layer 507 from the rest of the sensor stack. This is most conveniently done by using the insulating material in the remainder of the gap 511 in the vicinity 512 near the barrier layer. It is also desirable the lead material 513 which is adjacent to the free layer 508 to be nonmagnetic. A variation on this embodiment is to use a single ferromagnetic layer for the sensor pinned layer and bias exchange tabs comprising an AP pinned substructure for free layer bias stabilization wherein the bias tabs are on the same side of the free layer as the barrier layer.

Figure 6A:
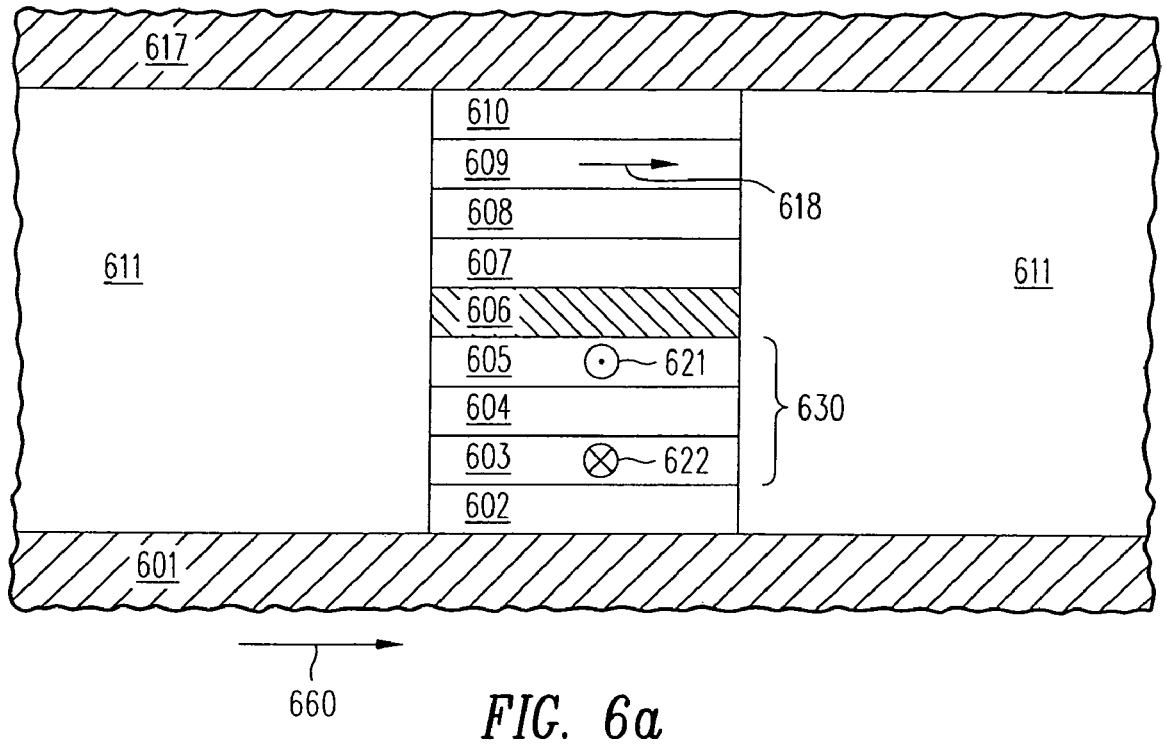
FIG. 6a shows a view of the layers in a sensor which has a pinned layer comprising an antiparallel pinned substructure and wherein the layers all have comparable widths.

Significant processing simplicity is achieved when all of the layers comprising the sensor stack are the same width. Alignment requirements are greatly reduced when all the layers are approximately equal to the desired trackwidth. FIGS. 6a,b and FIGS. 7a,b show embodiments of sensors where all the layers in the sensor stack are of substantially the same width. These configurations are sometimes called in-stack biasing schemes. One feature which the in-stack biasing schemes have in common is that using the invention disclosed wherein the entire sensor can be constructed without breaking the vacuum. For conventional sensors part of the sensor would be constructed, then the partly completed sensor would be removed from the vacuum systems used for fabrication for initialization of one of the AFM layers, then then sensor would be returned to the vacuum system for completion. The spin-flop method of initialization allows the complete sensor to be fabricated and then the initialization is accomplished with a single procedure.

FIG. 6a shows a first AFM layer 602 deposited on a lead 601. The sensor pinned layer is an AP pinned substructure 630 comprising two ferromagnetic layers 603, 605 separated by a nonmagnetic layer 604. A nonmagnetic separation layer 606 separates the free layer 607 from the pinned layer. The magnetic bias stabilization of the free layer 607 is provided by a ferromagnetic layer 609 weakly coupled to the free layer 607 with a nonmagnetic conducting layer 608. It is desireable that the free layer 607, nonmagnetic layer 608 and ferromagnetic layer 609 combination not exhibit significant spin-valve behavior. For this reason tantalum or ruthenium is convenient to use for the nonmagnetic layer 608. The direction of magnetization 618 in the ferromagnetic layer 609 is controlled by a second AFM layer 610. The direction of magnetization 618 is substantially perpendicular to the direction of magnetizations 621,622 in the AP pinned substructure 630. The second AFM layer 610 is adjacent to a lead 617. The areas 611 in the gap outside the sensor is filled with an insulating material.

Figure 6B:
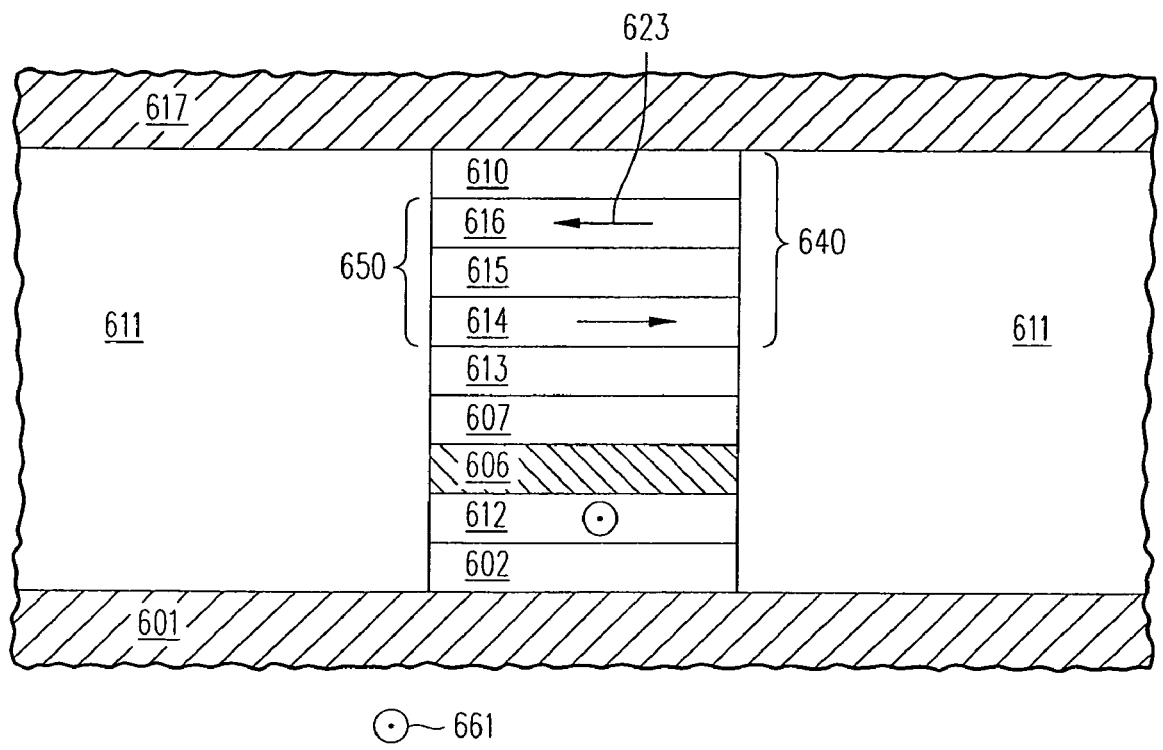
FIG. 6b shows a view of the layers in a sensor which has bias stabilization layers comprising an antiparallel pinned substructure and wherein the layers all have comparable widths.

FIG. 6b illustrates an alternative embodiment. In FIG. 6b a first AFM layer 602 is deposited on a lead 601. A single ferromagnetic layer 612 is deposited on the first AFM layer and serves as the pinned layer of the sensor. A nonmagnetic separation layer 606 is formed between the pinned layer 612 and the free layer 607. The next layer 613 is a nonmagnetic conductor which separates the biasing layers 640 from the free layer 607. The biasing layers 640 can be considered as a single biasing tab. Two ferromagnetic layers 614, 616 separated by a nonmagnetic layer 615 comprise the AP pinned substructure 650 of the bias tab 640. The second AFM layer 610 is located between the AP pinned substructure 650 and a lead 617.

Figure 7A:
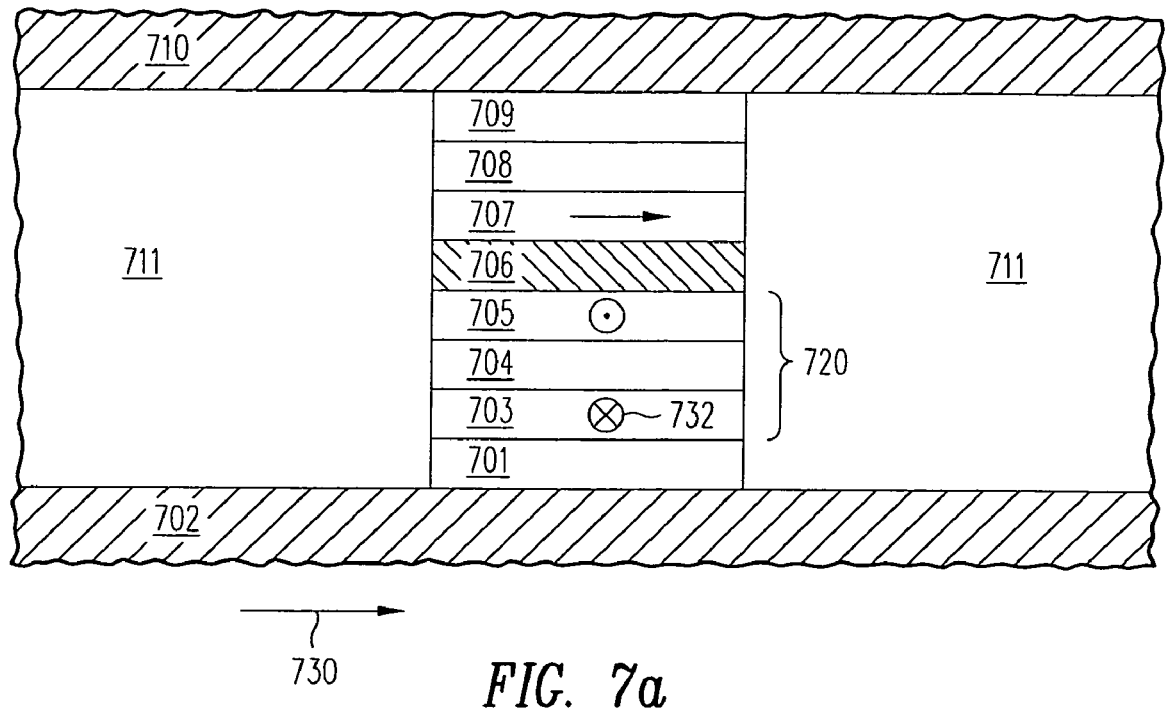
FIG. 7a shows a view of the layers in a sensor which has a pinned layer comprising an antiparallel pinned substructure, the layers have comparable widths, and the bias stabilization is provided by separating an AFM layer from the free layer by a nonmagnetic layer.

Another embodiment is shown in FIG. 7a. A first AFM layer 701 is deposited on a lead 702. The sensor pinned layer is an AP pinned substructure 720 comprising two ferromagnetic layers 703, 705 separated by a nonmagnetic layer 704. The AP pinned substructure 720 is placed on the first AFM layer 701. A nonmagnetic separation layer 706 separates the free layer 707 from the AP pinned substructure 720. A layer of copper or other nonmagnetic conductor 708 is then deposited on the free layer 707 and a second AFM layer 709 is placed on the layer 708. To complete the sensor, a lead 710 is placed on the second AFM layer 709. The other space in the gap is filled with an insulator 711. This is an unusual sensor in that AFM material is generally thought to offer only surface exchange coupling. As such it is unexpected that the second AFM layer 709 is effective in stabilizing the free layer 707 through the Cu layer 708. A thickness of copper which is effective is roughly from 1 to 2 nm. More information on the physics related to this behavior can be found in N. J. Gokenmeijer, et al, Phys. Rev. Lett. 79, 4270 (1997).

Figure 7B:
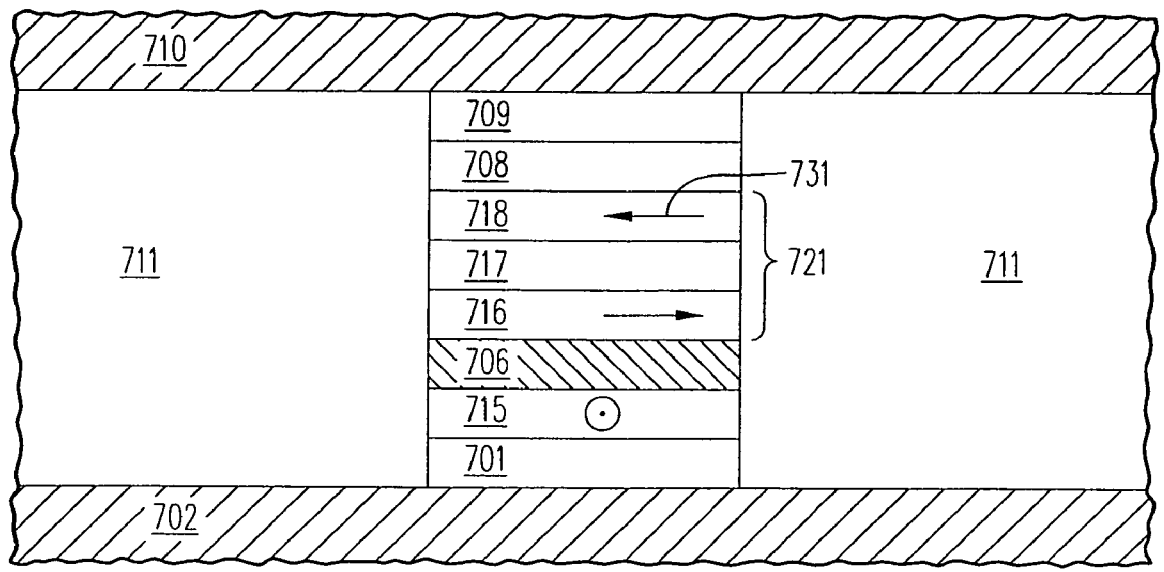
FIG. 7b shows a view of the layers in a sensor in which the free layer is an AP pinned substructure.

FIG. 7b shows an alternative embodiment. In FIG. 7b the first AFM layer 701 is formed on a first lead 702. A single ferromagnetic layer 715 serves as the sensor pinned layer. A nonmagnetic separation layer 706 separates the pinned layer 715 from the free layer. In FIG. 7b the free layer is comprised of an AP pinned substructure. This AP pinned substructure is comprised of a ferromagnetic layer 716 adjacent to the nonmagnetic separation layer 706, a nonmagnetic layer 717, and another ferromagnetic layer 718. The upper ferromagnetic layer 718 of the AP pinned substructure 721 is weakly coupled to a second AFM layer 709 through a conductor layer 708. Another lead 710 is then formed over the AFM layer 709. The other portions of the gap is filled with an insulating material 711. The sensor in FIG. 7b is unusual in that an AP pinned substructure is used as the free layer. This arrangement has the advantage that the net magnetic moment of the free layer may be significantly reduced compared with using a single ferromagnetic layer.

The present invention allows the use of the same AFM material to be used for setting both the pinned layer and the bias stabilization of the free layer. Thus the material may be chosen for optimal magnetic performance. The key feature in being able to use the same AFM material is to be able to initialize the layers given the same blocking temperature. The initialization process makes use of magnetic behavior generally referred to as a spin flop effect.

Figure 8A:
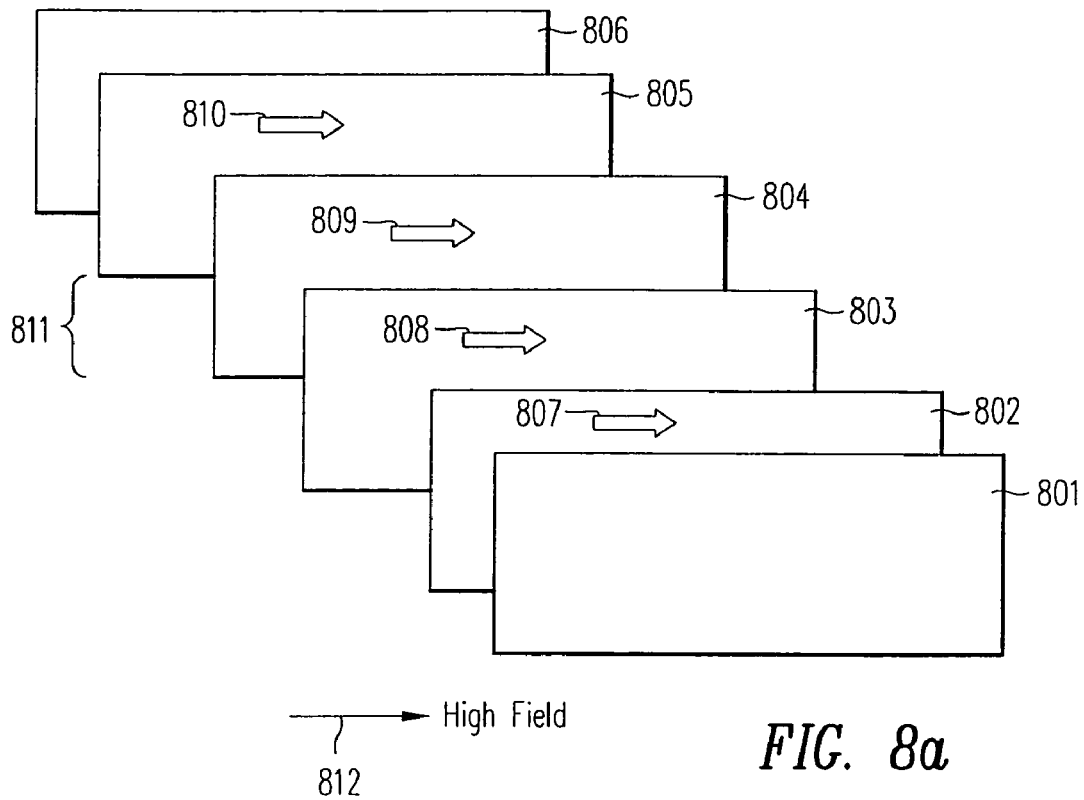
FIG. 8a shows the direction of magnetization in the layers of the sensor in the presence of a high magnetic field.
Figure 8B:
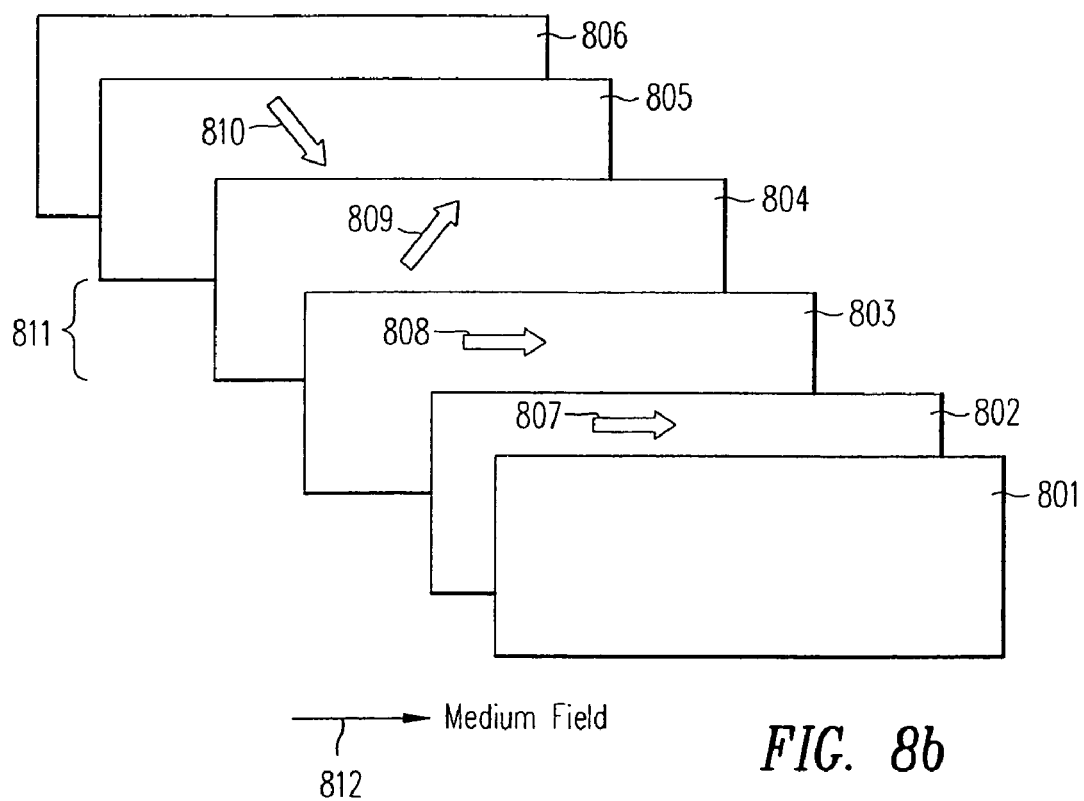
FIG. 8b shows the direction of magnetization in the layers of the sensor in the presence of a medium magnetic field.
Figure 8C:
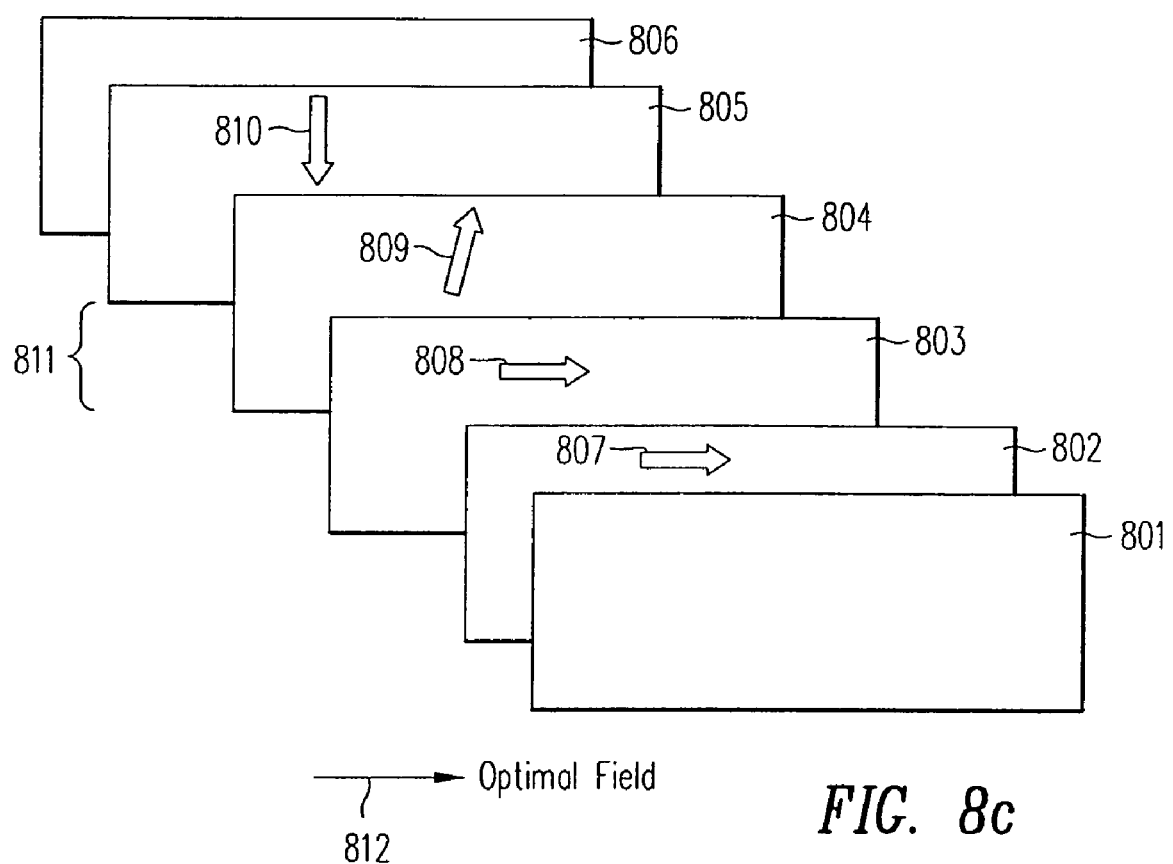
FIG. 8c shows the direction of magnetization in the layers of the sensor in the presence of the optimum magnetic field.

The use of the spin-flop effect to initialize a sensor is illustrated in FIGS. 8a–d. The sensor shown in exploded form in FIGS. 8a–c is the same sensor illustrated in FIG. 6a. Although the specific example discussed in FIGS. 8a,b,c,d is shown in detail for the sensor in FIG. 6a., the use of the spin-flop effect can be used on any of the sensors described above. In FIG. 8a the important magnetic layers in the sensor are shown including the first AFM exchange layer 806 adjacent to a first ferromagnetic layer 805, a second ferromagnetic layer 804, the free layer 803, a third ferromagnetic layer 802, and the AFM layer 801 adjacent to the third ferromagnetic layer 802. Also, the magnetization directions 807, 808, 809, 810 are shown. For clarity, the additional nonmagnetic layers are not shown. FIG. 8a shows the directions of magnetization 807, 808, 809, 810 when the structure has been placed in an external high magnetic field. The direction of the field is indicated 812. The bias stabilization layer 802 and the free layer 803 are weakly coupled for this particular sensor configuration. When the temperature of the AFM exceeds the blocking temperature, the magnetization of the bias stabilization layer 807 and the free layer 808 align with the applied external field 812 for high values of the applied field. For high values of the applied field the antiparallel coupling between the first ferromagnetic layer 805 and the second ferromagnetic layer 804 comprising the AP pinned layer 811 is broken and the magnetization of both the first ferromagnetic layer 810 and the second ferromagnetic layer 809 align with the applied field. This magnitude of field is not useful for initialization. As the applied field is reduced, the direction of the magnetizations 810, 809 in the pinned layer 811 will begin to rotate in order to seek the lowest energy. FIG. 8b shows the case where the magnetizations in the AP pinned substructure have begun to rotate as the magnitude of the applied field 812 is reduced. The magnetizations 810, 809 rotate away from the direction of the applied field 812 and in opposite directions from each other. This behavior is the spin-flop effect. More specific details of the physics related to the spin-flop effect may be found in Beach, et al., "AP-pinned spin valve GMR and magnetization" J. Appl. Phys. 87, p.5723 (2000).

FIG. 8c shows that at some optimum value of the applied field 812 the magnetization of the first ferromagnetic layer will be perpendicular to the applied external field 812 and perpendicular to the magnetization 807 of the bias stabilization layer 802 which is still aligned with the applied field 812. This is the value of the applied field which is used when cooling both AFM layers 806, 801 below the blocking temperature to achieve initialization. At the optimum external field value the direction of the magnetization 809 in the second ferromagnetic layer 804 need not be opposite from the magnetization 810 of the first ferromagnetic layer 805. However when the external field is removed, the magnetization 809 of the second ferromagnetic layer 804 will be substantially opposite from the magnetization 810 of the first ferromagnetic layer 805. Without using the spin-flop effect to induce the appropriate rotation of magnetization in an AP pinned substructure it is not practical to use the optimal choice of the same material for the two AFM layers because of the difficulty with initialization.

The same spin-flop effect can be utilized in initializing all of the sensors discussed above. The common feature is that there is at least one AP pinned substructure in each of the sensors. The only differences is in what direction to apply the external magnetic field and what magnitude of the external field to use. The direction of the external field used for initialization depends on where the AP pinned substructure is located in the sensor. In FIG. 3a the direction of the applied field 330 is perpendicular to the desired direction of the magnetization 316 in the ferromagnetic layer 303 adjacent to the AFM layer 301. In FIG. 3b the direction of the initialization field 331 is perpendicular to the direction of magnetization 320 in the ferromagnetic layer 314 adjacent to the AFM 310. In FIG. 4a the direction of the applied field 430 is perpendicular to the desired direction of the magnetization 420 in the ferromagnetic layer 403 adjacent to the AFM layer 402. In FIG. 4b the direction of the initialization field 431 is perpendicular to the direction of magnetization 421 in the ferromagnetic layer 413 adjacent to the AFM layer 414. In FIG. 5 the direction of the applied field 530 is perpendicular to the desired direction of the magnetization 520 in the ferromagnetic layer 503 adjacent to the AFM layer 502. In FIG. 6a the direction of the applied field 660 is perpendicular to the desired direction of the magnetization 622 in the ferromagnetic layer 603 adjacent to the AFM layer 602. In FIG. 6b the direction of the applied field 661 is perpendicular to the desired direction of the magnetization 623 in the ferromagnetic layer 616 adjacent to the AFM layer 610. In FIG. 7a the direction of the applied field 730 is perpendicular to the desired direction of the magnetization 732 in the ferromagnetic layer 703 adjacent to the AFM layer 701. In FIG. 7b the direction of the applied field 733 is perpendicular to the desired direction of the magnetization 731 in the ferromagnetic layer 718. As a general rule the direction of the initialization field is perpendicular to the direction of the magnetization of the ferromagnetic portion of the APP substructure which is exchange coupled to an AFM layer.

Figure 8D:
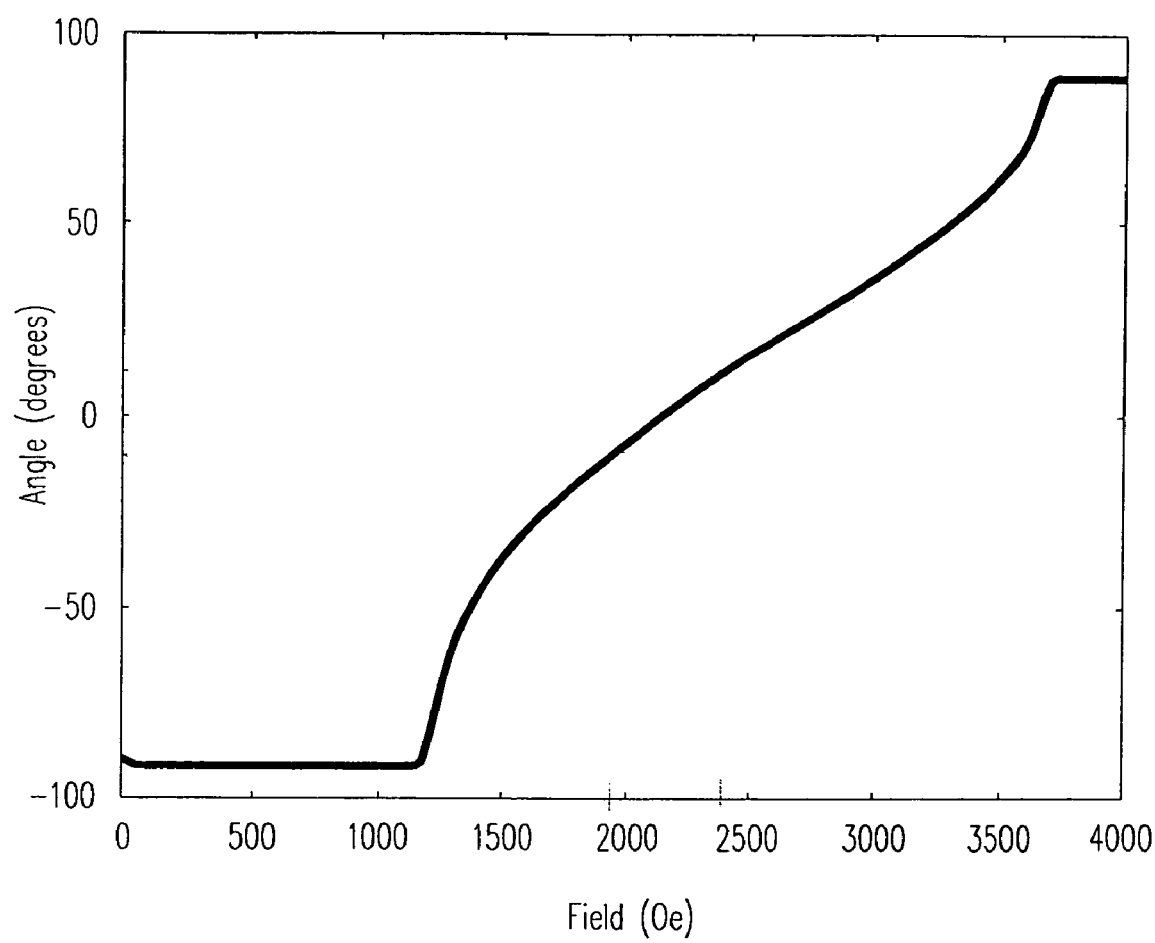
FIG. 8d shows the angle of the direction of magnetization in the ferromagnetic layer adjacent to the AFM layer for one specific antiparallel pinned substructure.

After the direction of the external magnetic field has been determined the magnitude must be chosen. FIG. 8d shows an example of the angle of the magnetization 810 in the first ferromagnetic layer 805 in the pinned layer 811 as a function of field magnitude. In FIG. 8d the angle is measured from the desired direction of the final angle. The targeted angle is 90° with respect to the field direction. Therefore the desired angle as shown in FIG. 8d is 0°. For this specific case, the coupling strength across the nonmagnetic layer is 0.5 erg/cm$^2$, and the moments/area of the first and second ferromagnetic layers are 0.2 and 0.4 memu/cm$^2$, respectively. The optimum field strength to achieve the spin-flop effect is approximately 2200 Oe for this specific example. Other structures with different materials, thicknesses, and moments would have a different optimal external field strength. Therefore the value of the optimal external field strength is somewhat different for each particular sensor. The optimal value of external field magnitude is also influenced to a small extent by process variations in the film layer properties. For this reason the optimum value is usually determined by first performing a process tolerance study using a specific sensor.

As a practical matter, better process consistency is achieved by first increasing the applied field to a high value and then reducing the magnitude until the optimum value is applied. However it is also possible to place the sensor directly into a field having the optimum value or to raise the field from an initial value of zero.

Figure 9A:
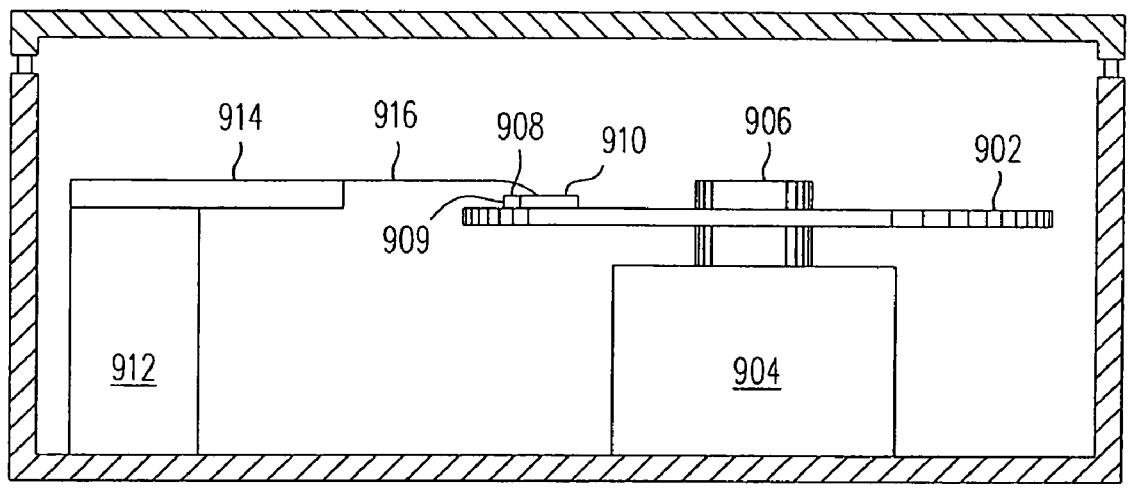
FIG. 9a shows a cross sectional view of a disk drive using the sensor of the present invention.
Figure 9B:
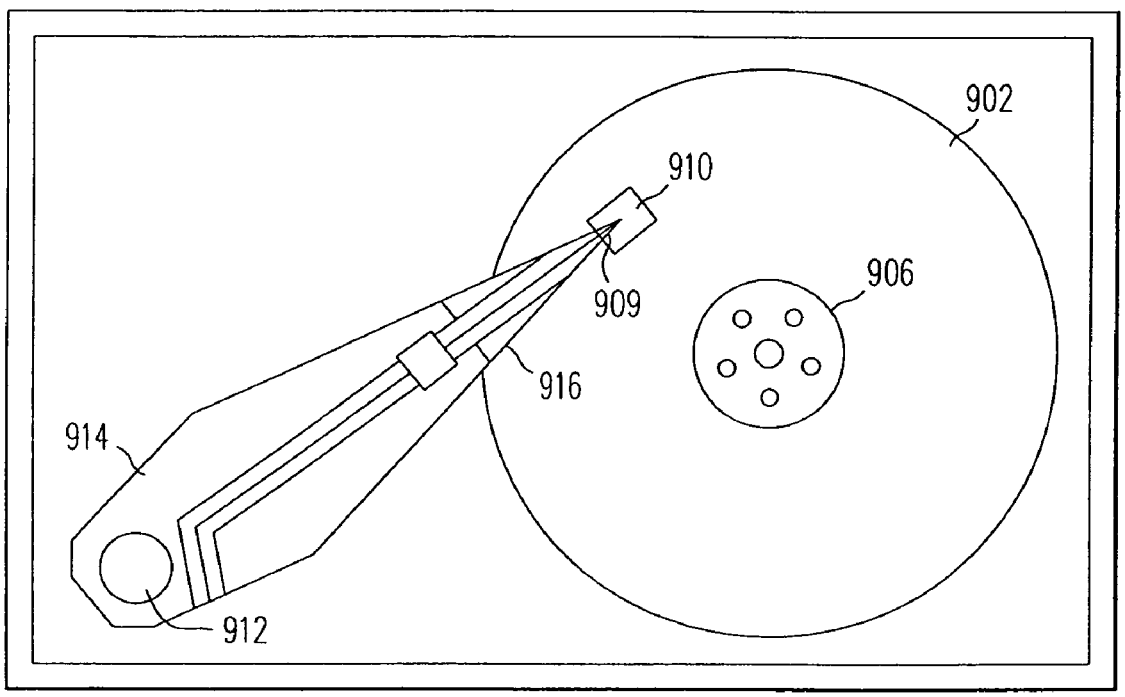
FIG. 9b show a top down view of a disk drive using the sensor of the present invention.

FIGS. 9a and 9b show the present invention as used in a magnetic recording disk drive. The magnetic recording disk 902 is rotated by drive motor 904 with hub 906, which is attached to the drive motor. The disk comprises a substrate, a magnetic layer, an optional overcoat layer such as carbon, and typically a lubricant layer such as a perfluoropolyether. The substrate is typically either aluminum, glass, or plastic. Some disk drives are designed such that the slider 910 comes to rest on the disk when the disk drive is stopped. In other disk drives, the slider is lifted off of the disk surface when the disk drive is turned off. The latter is preferable when the surfaces of the slider and the disk are designed to have very low roughness. This is advantageous for designs requiring frequent or continuous contact between the slider and the disk during normal operation.

A recording head assembly 908 is formed on the trailing surface of a slider 910. The slider has a trailing vertical surface 909. The recording head assembly usually comprises a separate write element along with the read sensor. The slider 910 is connected to the actuator 912 by means of a rigid arm 914 and a suspension 916. The suspension 916 provides a force which pushes the slider toward the surface of the recording disk 902.

An important use of these sensors is in disk drives. Another applications of these sensors can be the use in static memory storage devices and other devices requiring very high sensitivity.

While the invention has been described above in connection with preferred embodiments thereof and as illustrated by the drawings, those with skill in the art will readily recognize alternative embodiments of the invention can be easily produced which do not depart from the spirit and scope of the invention as defined in the following claims.

I claim:

1. A method of simultaneously initializing a first and second antiferromagnetic layer in a magnetic sensor, the method comprising:
    providing the sensor, wherein the sensor includes an AP pinned substructure having a first ferromagnetic layer with the first antiferromagnetic layer exchange coupled to said first ferromagnetic layer, the sensor also including the second antiferromagnetic layer supporting magnetic bias stabilization of a free layer;
    placing the sensor in an external magnetic field;
    adjusting the magnitude of said magnetic field to an optimum value to cause the magnetization of said first ferromagnetic layer in said AP pinned substructure to be substantially perpendicular to the external magnetic field direction;
    heating the sensor above the blocking temperature of both said first and second antiferromagnetic layers; and
    cooling the sensor below the blocking temperature of both the first and second antiferromagnetic layers in the presence of said external magnetic field.

2. A method of simultaneously initializing a first and second antiferromagnetic layer in a magnetic sensor, the method comprising:
    providing the sensor, which includes the first antiferromagnetic layer exchanged coupled to a pinned layer and the second antiferromagnetic layer exchanged coupled to a ferromagnetic layer, said ferromagnetic layer comprising a portion of an AP pinned substructure supporting magnetic bias stabilization of a free layer;
    placing the sensor in an external magnetic field;
    adjusting the magnitude of said external magnetic field to an optimum value to cause the magnetization of said ferromagnetic layer in said antiparallel pinned substructure to be substantially perpendicular to the external magnetic field direction;
    heating the sensor above the blocking temperature of both said first and second antiferromagnetic layers; and
    cooling the sensor below the blocking temperature of both the first and second antiferromagnetic layers in the presence of said external magnetic field.

3. A method of simultaneously initializing a first and second antiferromagnetic layer in a magnetic sensor, the method comprising:

provxxing the sensor, wherein the sensor includes an AP pinned substructure having a first ferromagnetic layer with the first antiferromagnetic layer exchange coupled to said first ferromagnetic layer, the sensor also including the second antiferromagnetic layer supporting magnetic bias stabilization of a free layer;

placing the sensor in an external magnetic field;

adjusting the magnitude of said magnetic field to approximately 2200 Oe;

heating the sensor above the blocking temperature of both said first and second antiferromagnetic layers; and cooling the sensor below the blocking temperature of both the first and second antiferromagnetic layers in the presence of said external magnetic field.

4. A method of simultaneously initializing a first and second antiferromagnetic layer in a magnetic sensor, the method comprising:

providing the sensor , wherein the sensor has the first antiferromagnetic layer exchanged coupled to a pinned layer and the second anti ferromagnetic layer exchanged coupled to a ferromagnetic layer, said ferromagnetic layer comprising a portion of an AP pinned substructure supporting magnetic bias stabilization of a free layer;

placing the sensor in an external magnetic field;

adjusting the magnitude of said external magnetic field to approximately 2200 Oe;

heating the sensor above the blocking temperature of both said first and second anti ferromagnetic layers; and cooling the sensor below the blocking temperature of both the first and second antiferromagnetic layers in the presence of said external magnetic field.

* * * * *